US008761956B2

(12) United States Patent  
Chen et al.

(10) Patent No.: US 8,761,956 B2
(45) Date of Patent: Jun. 24, 2014

(54) COMPUTER AND CONTROL METHOD FOR SMART FAN THEREOF (71) Applicant: MSI Electronic (Kun Shan) Co., Ltd., Kunshan (CN)

(72) Inventors: Chung-Wei Chen, New Taipei (TW); Wei-Cheng Wu, New Taipei (TW)

(73) Assignee: MSI Computer (Shenzhen) Co., Ltd., Shenzhen (CN)

( * ) Notice: Subject to any disclaimer, the term of this patent is extended or adjusted under 35 U.S.C. 154(b) by 36 days.

(21) Appl. No.: 13/711,283

(22) Filed: Dec. 11, 2012

(65) Prior Publication Data

US 2014/0054024 A1  Feb. 27, 2014

(30) Foreign Application Priority Data

Aug. 24, 2012 (TW) .............................. 101130912 A (51) Int. Cl.
| *G01K 17/00* | (2006.01) |
| *G01P 3/00* | (2006.01) |
| *G01P 5/00* | (2006.01) |
| *G05B 11/01* | (2006.01) |
| *G05B 13/02* | (2006.01) |
| *G05B 15/00* | (2006.01) |
| *G05D 13/00* | (2006.01) |
| *G05D 23/00* | (2006.01) |
| *G05D 23/185* | (2006.01) |
| *G06F 1/20* | (2006.01) |
| *G06F 3/041* | (2006.01) |
| *G06F 3/0481* | (2013.01) |
| *G06F 13/14* | (2006.01) |
| *G06T 11/20* | (2006.01) |
| *H05K 7/20* | (2006.01) |
| *G06F 3/0484* | (2013.01) |

(52) U.S. Cl.
CPC .......... *H05K 7/20209* (2013.01); *G05D 23/185* (2013.01); *G06F 1/20* (2013.01); *G06F 1/203* (2013.01); *G06F 1/206* (2013.01); *G06F 3/0484* (2013.01); *G06F 3/04817* (2013.01); *H05K 7/20836* (2013.01); *Y02B 60/1275* (2013.01)
USPC ................. 700/300; 700/17; 700/25; 700/28; 700/32; 700/83; 700/299; 700/304; 165/201; 165/247; 165/287; 165/288; 345/173; 345/440.1; 345/442; 345/520; 361/679.48; 361/688; 361/695; 702/130; 702/142; 702/145

(58) Field of Classification Search
CPC .......... G06F 1/20; G06F 1/203; G06F 1/206; G06F 3/0484; G05D 23/185; H05K 7/20836; H05K 7/20209; Y02B 60/1275
USPC .......... 700/17, 25, 28, 32, 83, 299, 300, 304; 165/201, 247, 287, 288; 345/173, 345/440.1, 442, 520; 361/679.48, 688, 695; 702/130, 142, 145
See application file for complete search history.

(56) References Cited

U.S. PATENT DOCUMENTS

| 8,374,725 B1* | 2/2013 | Ols ................................ 700/277 |
| 2002/0077781 A1* | 6/2002 | Liebl et al. .................... 702/183 |
| 2005/0030171 A1* | 2/2005 | Liu et al. ........................ 340/500 |
| 2005/0128700 A1* | 6/2005 | Alperin et al. ................ 361/687 |
| 2007/0162160 A1* | 7/2007 | Chang et al. .................... 700/25 |
| 2008/0306633 A1* | 12/2008 | Tunks et al. ................... 700/300 |

FOREIGN PATENT DOCUMENTS

| CN | 101561703 A | 10/2009 |
| TW | I235907 | 7/2005 |
| TW | 200900920 | 1/2009 |
| TW | 200950305 | 12/2009 |
| TW | 201301721 A1 | 1/2013 |

* cited by examiner

*Primary Examiner* — Mohammad Ali
*Assistant Examiner* — Jennifer L Norton
(74) *Attorney, Agent, or Firm* — Muncy, Geissler, Olds & Lowe, P.C.

(57) ABSTRACT

A computer and a control method for smart fan thereof are provided, wherein the computer includes a processor configured to control a smart fan under an UETFI bios mode. A sensed temperature value from a temperature sensor, and a current speed value of the smart fan are acquired. A real-time temperature curve and a real-time speed curve are traced in a dynamic updating zone of a graphical interface respectively according to the current temperature and the current speed value. A first control point and a second control point, which correspond to the smart fan, are obtained via a control zone of the graphical interface. A control curve is traced in the graphical interface according to the first and second control points. The speed of the smart fan is controlled according to the control curve.

12 Claims, 6 Drawing Sheets

COMPUTER AND CONTROL METHOD FOR SMART FAN THEREOF

CROSS-REFERENCE TO RELATED APPLICATIONS

This non-provisional application claims priority under 35 U.S.C. §119(a) on Patent Application No(s). 101130912 filed in Taiwan, R.O.C. on Aug. 24, 2012, the entire contents of which are hereby incorporated by reference.

BACKGROUND

1. Technical Field

The disclosure is related to a computer and a control method for fan thereof, especially to a computer having smart fan and to a control method for smart fan thereof.

2. Related Art

With the development of manufacture technique, more and more electronic components are disposed in various computer devices in more complex way. Lightness and thinness are very important concerns for computer's design, so the electronic components within a computer are arranged very closely. However, such electronic components may cause a great deal of heat while operating, so the heat dissipation becomes a very important concern in computer's design.

Generally, fan speed control and noise problem are key points in the aspect of dissipating heat. While the fan speed becomes faster, noise caused by the fan becomes loader. Thus, a traditional fan operates only at a fixed speed after actuated. In order to increase heat dissipation efficiency and to reduce noise, a smart fan with multi-states speed control is developed, which is adjusted the speed thereof according to various temperatures. Present smart fan cooperating with temperature sensor is controlled to change the speed thereof according to a fixed temperature control curve.

Nevertheless, when user controls such a smart fan in a traditional basic input output system (BIOS), the current sensed temperature value and the current sensed speed are shown only by texts. Thus, user can not know the current operation efficiency of smart fan and observe the internal devices of computer device immediately. When the amount of smart fan is increased, it is more difficult for user to monitor the operation of each smart fan. As a result, it is difficult to adjust the speed of smart fan according current conditions appropriately.

In other word, the methods for displaying information concerning to control smart fan in the BIOS mode are less presently. It is difficult for user to know the operation state of smart fan and the heat dissipation state of computer device. This may cause the problem of controlling the speed of smart fan inefficiently.

SUMMARY

As set forth above, the disclosure discloses a computer and a control method for smart fan. The computer includes at least one smart fan, at least one temperature sensor and a processor. The processor is configured to perform the control method.

The control method for smart fan is adapted to control the at least one smart fan in a computer under a unified extensible firmware interface basic input output system (UEFI BIOS) mode. A sensed temperature value from the temperature sensor, and a current speed value of the smart fan are acquired. According to the sensed temperature value and the current speed value, a real-time temperature curve and a real-time speed curve are traced in a dynamic updating zone of a display screen respectively. A first control point and a second control point, which correspond to the smart fan, are obtained through a graphical interface (GI) of a display screen. According to the second control point and the first control point, a control curve is traced. According to the control curve, the speed of the smart fan is controlled. The real-time temperature curve and the real-time speed curve show the states of sensed temperature value and the states of current speed value in a preset period respectively.

In one embodiment, the amount of the temperature sensors is plural. A first switch instruction triggered by one of a plurality of sensor switch icons in the GI is received. The sensor switch icons correspond to the temperature sensors respectively. The first switch instruction dictates to one of the temperature sensors. A sensed temperature value from the dictated temperature sensor is acquired. According to the sensed temperature value from the dictated temperature sensor, the real-time temperature curve corresponding to the dictated temperature sensor is traced in the dynamic updating zone of the GI.

The amount of the smart fan is plural. A second switch instruction triggered by one of a plurality of the fan switch icons of the GI is received. The fan switch icons correspond to the smart fans respectively. The second switch instruction dictates one of the smart fans. A current speed value of the smart fan is acquired. According to the current speed value of the dictated smart fan, a real-time speed curve corresponding to the dictated smart fan is traced in the dynamic updating zone of the GI.

The first control point corresponds to a first control temperature value and a first control speed value respectively. The second control point corresponds to a second control temperature value and a second control speed value respectively. A first control temperature value, a first control speed value, a second control temperature value and a second control speed value are acquired, and the first control temperature value, the first control speed value, the second control temperature value and the second control speed value are set by a plurality of sliding bars or a plurality of pull down menus in the control zone.

In one embodiment of the control method, a control slop of the control curve is further calculated according to an upper speed limit value, an upper temperature limit value and a plug-in coefficient. The control slop is set as follows:

$$\text{Slop} = \frac{(CP - SL1 \times SP2)/SL1}{|CT2 - CT1|/(TL1 \times P1)}$$

where, Slop is the control slop, CP is a current speed value, SL1 is an upper speed limit value, SP2 is a second control speed value, CT1 is the first control temperature value, CT2 is the second control temperature value, TL1 is the upper temperature limit value, and P1 is the plug-in coefficient.

When the computer is not over clock, the plug-in coefficient is equal to 1. When the computer is over clock, the plug-in coefficient is an overclock memory frequency rate, a memory voltage increasing rate, a central processing unit (CPU) voltage increasing rate or a CPU clock multiplier factor. The overclock memory frequency rate is a result that an overclock memory frequency is divided by a normal memory frequency.

In other embodiment, a control slop of the control curve is calculated according to a CPU voltage increasing rate. The control slop is set as follows:

$$\text{Slop} = \frac{(CP - SL1 \times SP2)/SL1}{|CT2 - CT1|/(TL1 \times PR1)}$$

where, Slop is the control slop, CP is a current speed value, SL1 is an upper speed limit value, SP2 is a second control speed value, CT1 is the first control temperature value, CT2 is the second control temperature value, TL1, is the upper temperature limit value, and PR1 is the CPU voltage increasing rate.

Moreover, either the first control speed value is determined whether to be smaller than a preset lower speed limit value, or the second control speed value is determined whether to be greater than a preset upper speed limit value. When the first control speed value is smaller than the preset lower speed limit value or when the second control speed value is greater than the preset upper speed limit value, an alerting message is issued, and then the speed of the smart fan is controlled according to the control slop. When the first control speed value is greater than or equal to the preset lower speed limit value and when the second control speed value is smaller than or equal to the preset upper speed limit value, and then the speed of the smart fan is controlled according to the control slop.

In one embodiment, a dictation mode is selected, so the first control temperature value, the first control speed value, the second control temperature value and the second control speed value are set indirectly. The dictation mode corresponds to the first control point and the second control point. The dictation mode is selected via a plurality of sliding bars or a plurality of pull down menus in the control zone.

For purposes of summarizing, some aspects, advantages and features of some embodiments of the disclosure have been described in this summary. Not necessarily all of (or any of) these summarized aspects, advantages or features will be embodied in any particular embodiment of the disclosure. Some of these summarized aspects, advantages and features and other aspects, advantages and features may become more fully apparent from the following detailed description and the appended claims.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

The detailed features and advantages of the disclosure are described below in great detail through the following embodiments, the content of which is sufficient for those of ordinary skill in the art to understand the technical content of the disclosure and to implement the disclosure accordingly. Based upon the content of the specification, the claims, and the drawings, those of ordinary skill in the art can easily understand the relevant objectives and advantages of the disclosure.

The disclosure provides a computer and a control method for a smart fan thereof. The control method for a smart fan is adapted to control at least one smart fan in the computer in a unified extensible firmware interface basic input output system (UEFI BIOS) mode. The UEFI BIOS is an advancer BIOS and may support various display and control methods as compared with a traditional BIOS.

Figure 1:
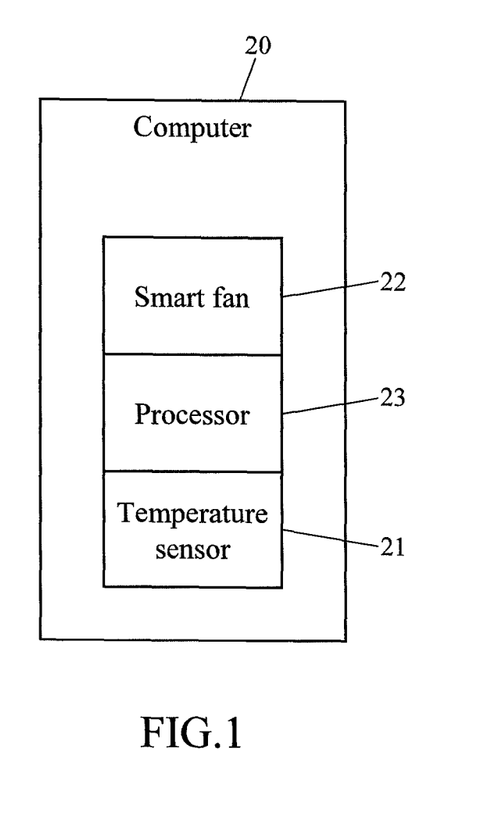
FIG. 1 is a block diagram of a computer according to one embodiment of the disclosure.

The computer includes at least one smart fan, at least one temperature sensor and a processor. The processor is configured to perform the control method for a smart fan and before the power of the computer is actuated, may enter into the UEFI BIOS mode. In one embodiment as shown in FIG. 1, the computer 20 includes a smart fan 22 and a temperature sensor 21. The smart fan 22 and the temperature sensor 21 are disposed on the processor 23.

The computer 20 may be a desktop computer, a server, a notebook or other devices available to operate in the UEFI BIOS mode. Moreover, the computer 20 further includes other hardware units such as a graphic card, a memory, a network card or a hard disk. The temperature sensor 21 may be disposed at any hardware unit and output a signal of sensed temperature value.

The processor 23 may be a central processing unit (CPU) and electronically connect to other hardware units to control such hardware units. The smart fan 22 may adjust the speed thereof according to the sensed temperature value automatically. That is to say, the processor 23 may trace a control curve according to the sensed temperature value and then calculate a control slop of the control curve, and thereby adjust the speed of the smart fan 22 according to the control slop.

Figure 2:
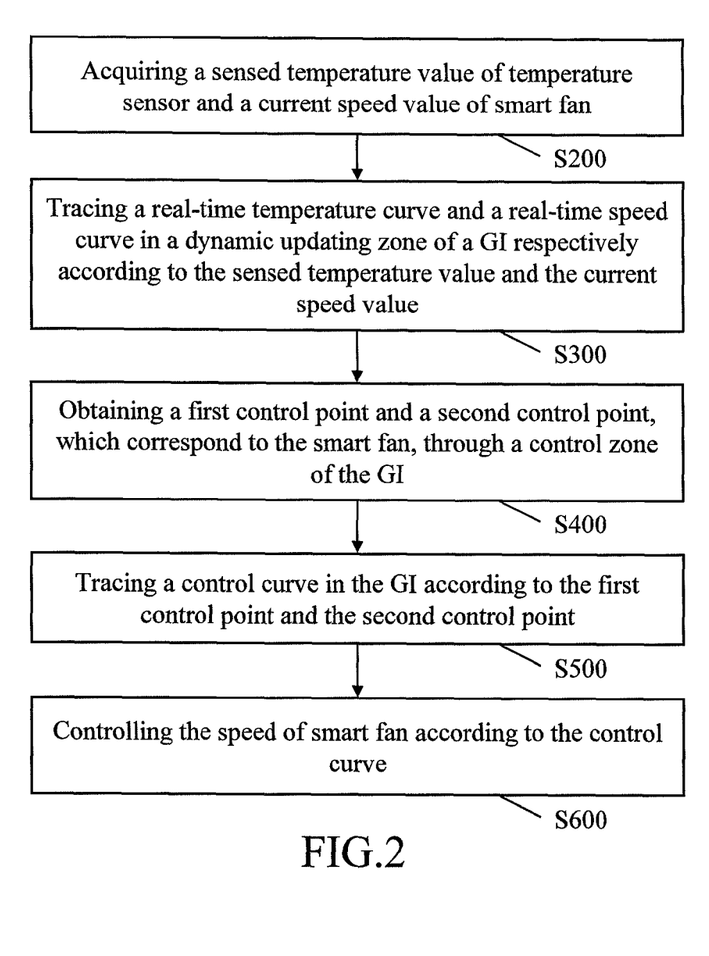
FIG. 2 is a flow chart of a control method for smart fan according to one embodiment implemented in FIG. 1.

FIG. 2 illustrates a flow chart of a control method for smart fan according to one embodiment implemented in FIG. 1. Initially, the processor 23 acquires a sensed temperature value from the temperature sensor 21 and a current speed value of the smart fan 22 as shown in step S200. The unit of the sensed temperature value may be Celsius' thermometric scale (° C.). The unit of the current speed value may be revolutions per minute (RPM).

Subsequently, the processor 23 may trace a real-time temperature curve and a real-time speed curve in a dynamic updating zone of a graphical interface (GI) in the UEFI BIOS mode respectively according to the sensed temperature value and the current speed value as shown in the step S300. Specifically, the processor 23 may continuously receive the signals of the sensed temperature value and of the current speed value, and the real-time temperature curve and the real-time speed curve may indicate the states of the sensed temperature value and of the current speed value respectively during a preset period. In one embodiment, the preset period may be 1 minute or 30 seconds.

Figure 3:
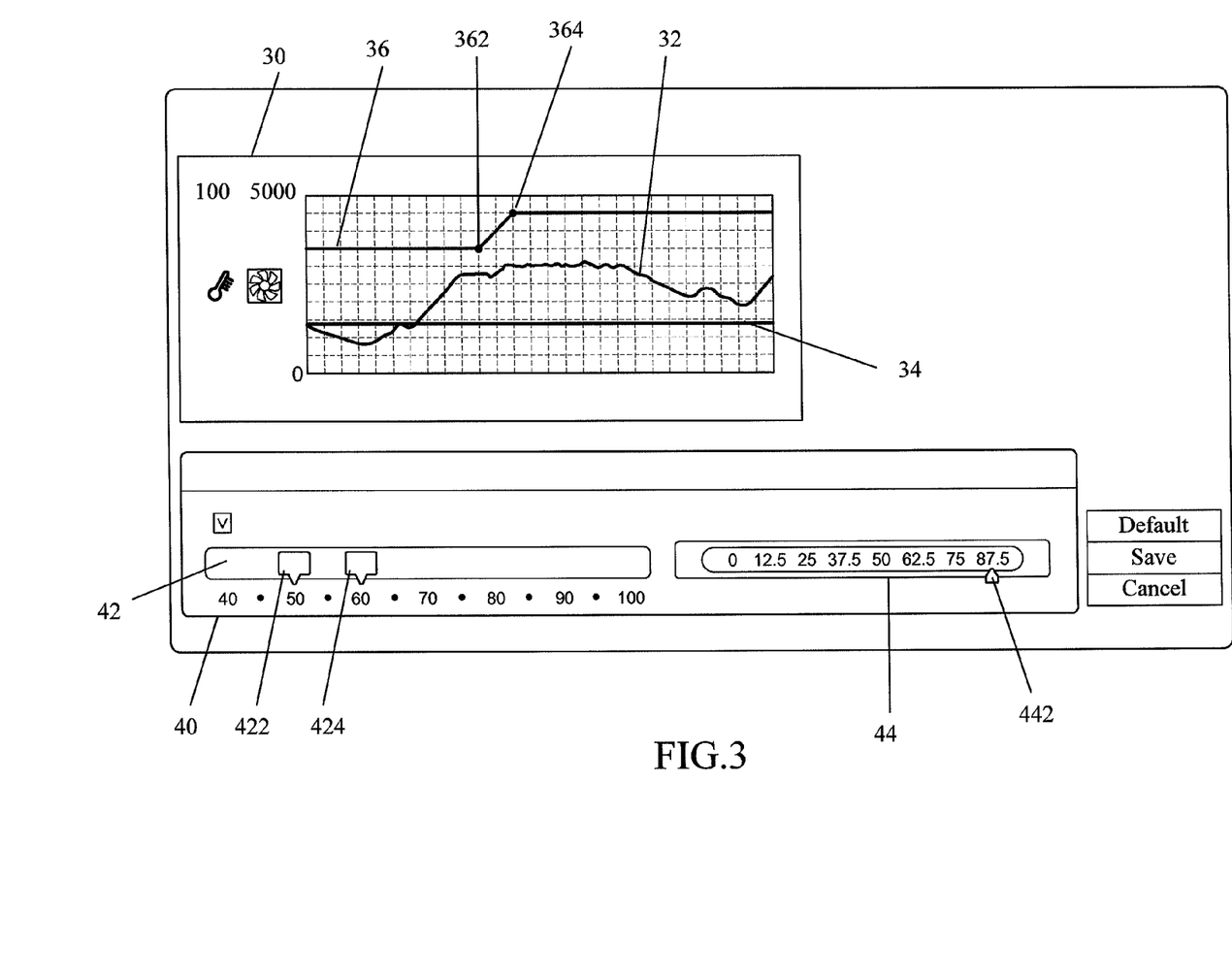
FIG. 3 is a schematic diagram of a graphical interface according to one embodiment of the disclosure.

FIG. 3 illustrates a schematic diagram of a graphical interface according to one embodiment of the disclosure. A dynamic updating zone 30 of a GI shows the real-time temperature curve 32 and the real-time speed curve 34 simultaneously. The real-time temperature curve 32 and the real-time speed curve 34 are waveform diagrams. The abscissa illustrates time, in which the right side thereof corresponds to the newest sensed temperature value and the newest speed, and in which other part thereof corresponds to previous sensed temperature values and previous speeds in the preset period. That is, the dynamic updating zone 30 may show the sensed temperature value and the current speed value in a preset period until now. The unit of the real-time speed curve 34 may be RPM or a percentage of an upper speed limit value of the smart fan 22 accounted by the current speed value.

It is for the illustration purpose to take two overlapped graphic layers showing the real-time temperature curve 32 and the real-time speed curve 34 respectively and having a color and a transparency respectively. This may be pleasing to user's eyes and clearly display the variations of the sensed temperature value and of the current speed value in the preset period. Thus, user may know the current operation state and operation performance of the smart fan 22 easily.

Furthermore, the processor 23 obtains a first control point 362 and a second control point 364, which correspond to the smart fan 22, via a control zone 40 of the GI as shown in the step S400. The processor 23 traces a control curve 36 in the GI according to the first control point 362 and the second control point 364 as shown in the step S500. In one embodiment, the control curve 36 is traced in a dynamic updating zone 30 of the GI. In other embodiment, the control curve 36 is traced in other zone of the GI.

The first control point 362 corresponds to a first control temperature value and a first control speed value respectively. The second control point 364 corresponds to a second control temperature value and a second control speed value respectively. The second control temperature value is greater than the first control temperature value. The second control speed value is greater than the first control speed value. User may use a keyboard, a mouse or a touch panel to set the first control temperature value, the first control speed value, the second control temperature value and the second control speed value in the control zone 40. The units of the first control speed value and of the second control speed value may be the percentage of an upper speed limit value of the smart fan 22.

In one embodiment, between the steps S300 and S400, the processor 23 may continuously determine whether an input device of the computer 20, such as a keyboard, a mouse or a touch panel, is triggered. If the input device is triggered, this means that user willingly operate the GI. Herein, the processor 23 may set the first control temperature value, the first control speed value, the second control temperature value and the second control speed value according to user's operation. The detailed embodiment is described as follows.

The computer 20 may obtain the first control temperature value, the first control speed value, the second control temperature value and the second control speed value, and the first control temperature value, the first control speed value, the second control temperature value and the second control speed value are set by a plurality of sliding bars or a plurality of pull down menus in control zone 40. In one embodiment shown in FIG. 3, the control zone 40 may include a temperature setting sliding bar 42 and a speed setting sliding bar 44. There are a first temperature setting icon 422 and a second temperature setting icon 424 in the temperature setting sliding bar 42. There is a speed setting icon 442 in the speed setting sliding bar 44. The first temperature setting icon 422 and the second temperature setting icon 424 correspond to the first control point 362 and the second control point 364 respectively.

User may use keyboard, mouse or touch panel to drag or click the first temperature setting icon 422 in the temperature setting sliding bar 42 so as to set the first control temperature value, or to drag or click the second temperature setting icon 424 in the temperature setting sliding bar 42 so as to set the second control temperature value. The speed setting icon 442 cooperates with the first temperature setting icon 422 and the second temperature setting icon 424 respectively. That is, after dragging or clicking the first temperature setting icon 422, user further drag or click the speed setting icon 442 in the speed setting sliding bar 44 so as to set the first control speed value, or after dragging or clicking the second temperature setting icon 424, user further drag or click the speed setting icon 442 in the speed setting dragging bar 44 so as to set the second control speed value.

Specifically, user may first drag the first temperature setting icon 422 to set the first control temperature value at 50° C. After the first temperature setting icon 422 is selected, user further drags the speed setting icon 442 to set the first control speed value at 62.5%. Subsequently, user drags the second temperature setting icon 424 firstly to set the second control temperature value at 60° C. After the second temperature setting icon 424 is selected, user further drags the speed setting icon 442 to set the second control speed value at 87.5%. As a result, user may set the first control point 362 and the second control point 364 simply and intuitively (directly) via the control zone 40 of the GI.

The processor 23 may be linked to the first control point 362 and the second control point 364. When the temperature is smaller than the first control temperature value, the processor 23 sets the speed of the smart fan 22 at the first control speed value. When the temperature is grater than the second control temperature value, the processor 23 sets the speed of the smart fan 22 at the second control speed value. Thus, the processor 23 may trace the control curve 36 in the GI according to such a rule.

Instead of the temperature setting sliding bar 42 and the speed setting sliding bar 44, pull down menus or text fields or etc. may be used to set the first control temperature value, the first control speed value, the second control temperature value and the second control speed value. Moreover, the present setting of the GI may be saved as a file so as to be installed in the GI and used sometime, and initial default values in the computer 20 may be installed in the GI. The GI supports that such a present setting of the GI is save as a file so as to be installed in the GI sometime, and that initial default values in the computer 20 may be installed in the GI.

After the control curve 36 is traced, the processor 23 controls the speed of the smart fan 22 according to the control curve 36 as shown in the step S600. The processor 23 may calculate and obtain a control slop according to the first control point 362, the second control point 364 and the current speed value and slow down or speed up the smart fan 22 according to the control slop. The details of calculating the control slop and of the step S600 are described as below.

Figure 4:
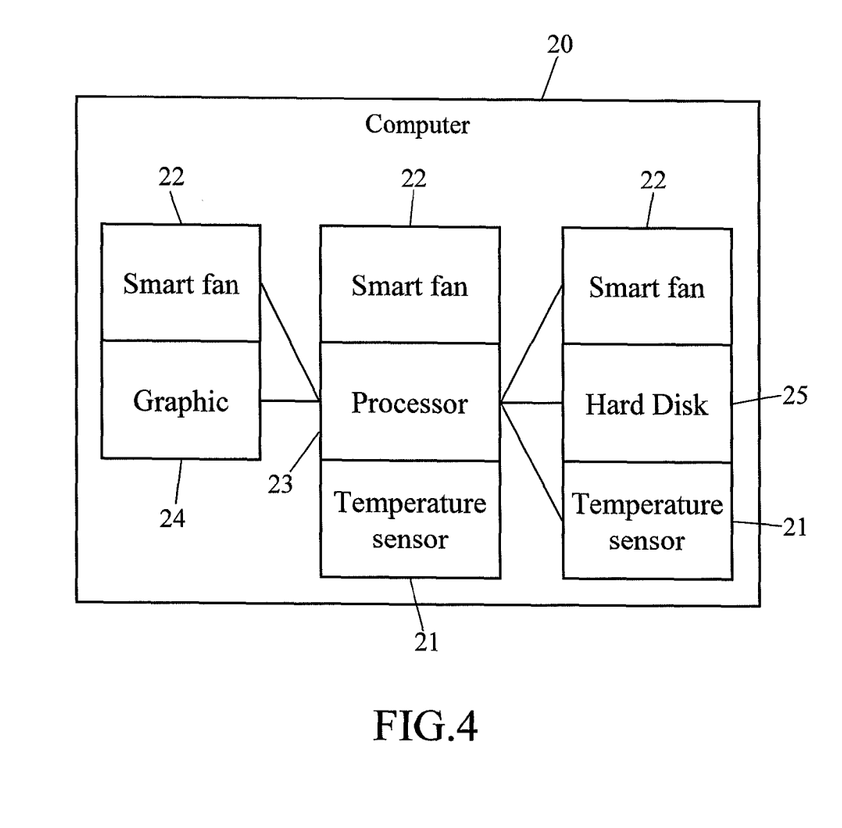
FIG. 4 is a block diagram of a computer according to other embodiment of the disclosure.

FIG. 4 illustrates a block diagram of a computer according to other embodiment of the disclosure. The amount of the smart fan 22 or of the temperature sensor 21 may be plural. The computer 20 further includes a graphic card 24 and a hard disk 25. One smart fan 22 is disposed on the graphic card 24. One smart fan 22 and one temperature sensor 21 are disposed on the hard disk 25. The GI further includes a plurality of switch icons corresponding to various smart fans 22 and temperature sensors 21. Thus, user may respectively observe the corresponding real-time temperature curve 32 generated according to the operation of one of the temperature sensors 21, and the corresponding real-time speed curve 34 generated according to the operation of one of the smart fans 22. The temperature sensors 21 may be an external sensor and disposed on the graphic card 24 on a main board of the computer 20. Nevertheless, it is not necessary that the temperature sensors 21 and the smart fans 22 are disposed on a hardware unit in pairs.

Figure 5:
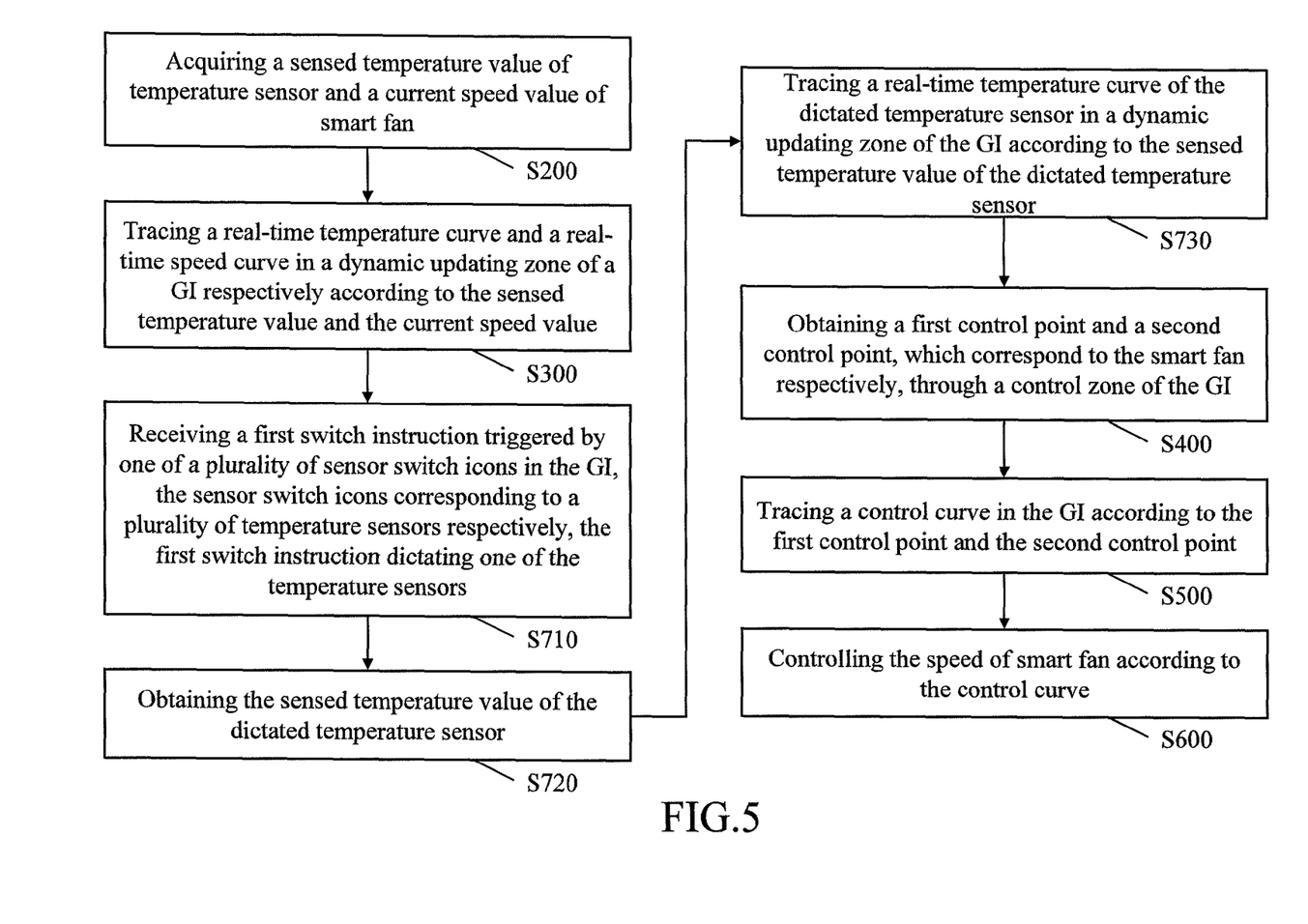
FIG. 5 is a flow chart of a control method for smart fan according to one embodiment implemented in FIG. 4.
Figure 6:
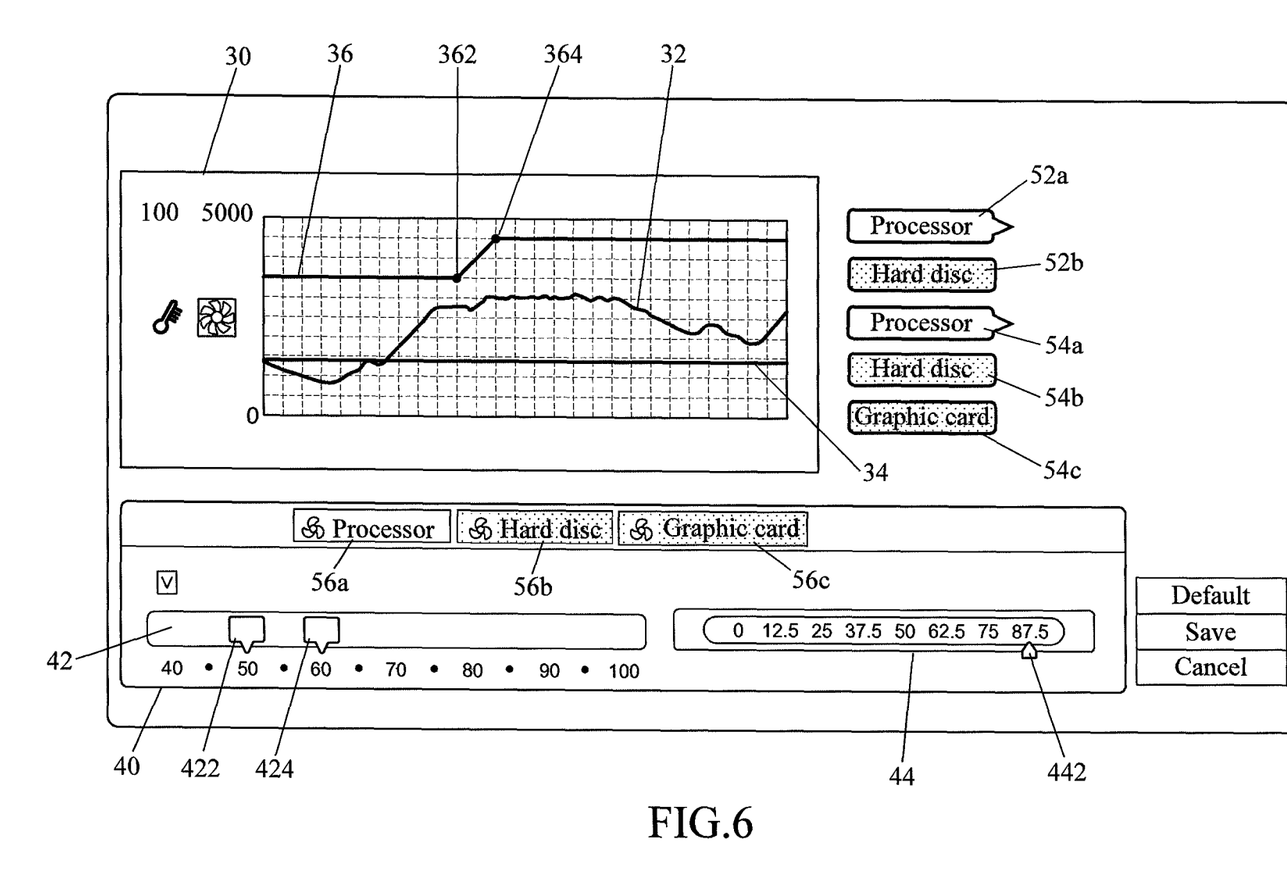
FIG. 6 is a schematic diagram of a graphical interface according to one embodiment of implemented in FIG. 4.

Referring to FIG. 5 and FIG. 6, a control method and a GI in one embodiment are shown. The GI may include a plurality of sensor switch icons 52a or 52b (hereinafter named as sensor switch icons 52). The operation of one of a plurality of temperature sensors 21 may be preset to be shown on the GI firstly. The processor 23 may acquire the signal of the sensed temperature value from the preset temperature sensor 21 to trace the real-time temperature curve 32 as shown in the step S200 and the step S300.

When desiring to observe the operation of other temperature sensor 21, user is allowed to click one corresponding sensor switch icon 52, e.g. the sensor switch icon 52a, to produce a first switch instruction which is further received by the processor 23 as shown in the step S710, that is, the processor 23 receives the first switch instruction triggered by the sensor switch icon 52 in the GI. One sensor switch icon 52 corresponds to one temperature sensor 21. The first switch instruction dictates one of the temperature sensors 21.

After receiving the first switch instruction, the processor 23 obtains the sensed temperature value from the dictated temperature sensor 21 as shown in the step S720, and then traces the real-time temperature curve 32, which corresponds to the dictated temperature sensor 21, in the dynamic updating zone 30 of the GI under the UEFI BIOS mode according to the sensed temperature value from the dictated temperature sensor 21 as shown in the step S730.

Subsequently, the processor 23 may continuously determine any input device of the computer 20, such as a keyboard, a mouse or a touch panel, is triggered or not. When one input device is triggered, the steps S400 to S600 are performed to set the first control point 362 and the second control point 364 to control the speed of the smart fan 22.

Figure 7:
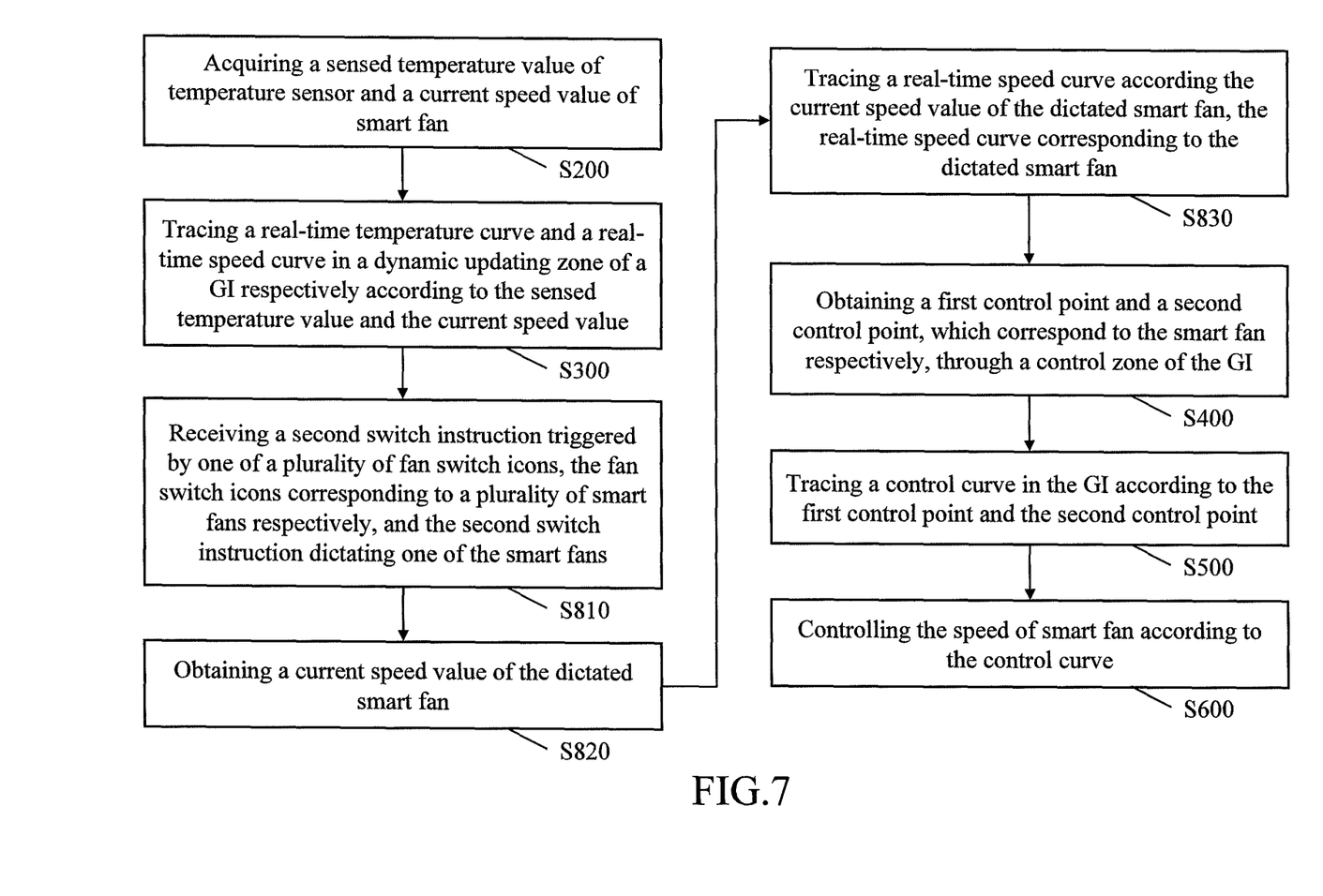
FIG. 7 is a flow chart of a control method for smart fan according to other embodiment implemented in FIG. 4.

Referring to FIG. 6 and FIG. 7, the control method is provided according to other embodiment of the disclosure. The GI may include a plurality of fan switch icons 54a, 54b or 54c (hereinafter named as fan switch icons 54. The operation of one of a plurality of smart fans 22 may be preset to be shown on the GI firstly. The processor 23 may firstly acquire a signal concerning to the current speed value of the preset smart fan 22 to trace the real-time speed curve 34 as shown in the steps S200 and S300.

When desiring to observe the operation of other smart fan 22, user is allowed to click one corresponding fan switch icon 54, e.g. the fan switch icon 54a, to produce a second switch instruction which is further received by the processor 23 as shown in the step S810, that is, the processor 23 receives the second switch instruction triggered by the fan switch icon 54 in the GI. One fan switch icon 54 corresponds to one smart fan 22. The second switch instruction dictates one of the smart fans 22.

After receiving the second switch instruction, the processor 23 obtains the current speed value of the dictated smart fan 22 as shown in the step S820, and then traces the real-time speed curve 34, which corresponds to the dictated smart fan 22, in the dynamic updating zone 30 of the GI under the UEFI BIOS mode according to the current speed value of the dictated smart fan 22 as shown in the step S830.

Subsequently, the processor 23 may continuously determine any input device of the computer 20, such as a keyboard, a mouse or a touch panel, is triggered or not. When one input device is triggered, the steps S400 to S600 are performed by the processor 23 to set the first control point 362 and the second control point 364 to control the speed of the smart fan 22.

Similarly, user may set a plurality of switch icons 56a, 56b or 56c (hereinafter named as the switch icons 54) to set one of the smart fans 22 according to user's request. The switch icons 56a-56b and 56c are linked to the smart fan 22 of the graphic card 24, the processor 23 and the hard disk 25 respectively. In one embodiment, user may click the switch icon 56b to set the first control point 362 of or the second control point 364 of the smart fan 22 on the hard disk 25.

According to various embodiments, the amount of the temperature sensors 21 disposed on a single hardware unit of the computer 20 may be different from the amount of the smart fans 22 disposed on the common hardware unit. In one embodiment, a single temperature sensor 21 and a single smart fan 22 are disposed on the processor 23. In other embodiment, a single temperature sensor 21 and a plurality of smart fans 22 are disposed on the processor 23. In other embodiment, a plurality of temperature sensors 21 and a plurality of smart fans 22 are disposed on the processor 23. Otherwise, a pair of temperature sensor 21 and smart fan 22 may be shared by a plurality of hardware units.

The processor 23 may either show the real-time temperature curve 32 corresponding to the first switch instruction, or show the real-time speed curve 34 corresponding to the second switch instruction. The GI supports user to dictate a plurality of temperature sensors 21 and a plurality of smart fans 22, and traces a plurality of corresponding real-time temperature curve 32 and a plurality of corresponding real-time speed curve 34 with various colors or with various graphic layers having various transparencies. Furthermore, the detailed descriptions of calculating the control slop and of controlling the speed of the smart fan 22 according to the control slop are as follows.

In one embodiment, the processor 23 may calculate a control slop of the control curve 36 according to a current speed value CP, a second control speed value SP2, an upper speed limit value SL1 of the smart fan 22, a upper temperature limit value TL1 in a preset tolerance range, a first control temperature value CT1, a second control temperature value CT2 and a plug-in coefficient P1 as follows:

$$\text{Slop} = \frac{(CP - SL1 \times SP2)/SL1}{|CT2 - CT1|/(TL1 \times P1)} \quad (a)$$

where, Slop is the control slop, CP is a current speed value, SL1 is an upper speed limit value, SP2 is a second control speed value, CT1 is the first control temperature value, CT2 is the second control temperature value, TL1 is the upper temperature limit value, and P1 is the plug-in coefficient.

When the computer 20 is not over clock, the plug-in coefficient P1 is equal to 1. When the computer 20 is over clock, the plug-in coefficient P1 may be an overclock memory frequency rate, a memory voltage increasing rate, a CPU voltage increasing rate or a CPU clock multiplier factor. A memory and a CPU may have a memory core voltage and a CPU core voltage respectively in production thereof. A core voltage is an operation voltage required by a hardware unit operating. In one embodiment, after the CPU is booted up, the CPU would require a main board to supply a suitable CPU core voltage, e.g. 1.2 volt. The memory core voltage may be recorded in a serial presence detect (SPD).

User may directly adjust the operation voltages of memory or of CPU supplied. In one embodiment, the operation voltage is reduced to be smaller than the core voltage, and such a state is called as "voltage reducing." In other embodiment, the operation voltage is increased to be greater than the core voltage, and such a state is called as "voltage increasing." The speed of smart fan 22 is increased or reduced through the control method, so the computer 20 still operates stably when the computer 20 is over clock.

Specifically, a memory voltage increasing rate is a percentage of the memory core voltage accounted by a voltage increment resulted in by subtracting the memory core voltage from the operation voltage of memory. A CPU voltage increasing rate is the percentage of the CPU core voltage accounted by a voltage increment resulted in by subtracting the CPU core voltage from the operation voltage of CPU. In one embodiment, when the memory core voltage is equal to 1.5 volt and the current operation voltage of memory is equal to 1.65 volt, the memory voltage increasing rate is equal to 10 percent, $$\left(\frac{1.65-1.5}{1.5}\times 100\%=10\%\right).$$

When the computer 20 is not over clock, the current speed value of the smart fan 22 is 3500 RPM, the upper speed limit value of the smart fan 22 is 5000 RPM, the second control speed value is 50%, the first control temperature value is 40° C., the second control temperature value is 50° C., and a preset upper temperature limit value is equal to 100° C. The control slop is calculated by using the equation (a) and such parameters so as to result in that the control slop is 2, $$\left(\frac{(3500-5000\times 50\%)/5000}{|50-40|/(100\times 1)}=2\right).$$

Thus, while the sensed temperature value is increased by every 1° C., the speed of the smart fan 22 is increased by 2%.

In other embodiment, the processor 23 may calculate a control slop of the control curve 36 according to a CPU voltage increasing rate or a memory voltage increasing rate as follows:

$$\text{Slop}=\frac{(CP-SL1\times SP2)/SL1}{|CT2-CT1|/(TL1\times PR1)} \quad \text{(b)}$$

where, Slop is the control slop, CP is the current speed value, SL1 is an upper speed limit value, SL2 is a lower speed limit value, CT1 is the first control temperature value, CT2 is the second control temperature value, TL1 is the upper temperature limit value, and PR1 is the CPU voltage increasing ratio.

When the computer 20 is over clock, the current speed value CP and the upper speed limit value SL1 of the smart fan 22 are 3500 RPM and 5000 RPM respectively, the second control speed value SP2 is 50%, the first control temperature value CT1 is 40° C., the second control temperature value CT2 is 50° C., the preset upper temperature limit value is equal to 100° C., the operation voltage of the CPU is equal to 1.3 volt, the CPU core voltage is equal to 1.2 volt. The control slop is calculated by using the equation (b) and such parameters so as to result in that the control slop is 24, $$\left(\frac{(3500-5000\times 50\%)/5000}{|50-40|/100\times(|1.3-1.2|/1.2)}=24\right).$$

In other word, while the sensed temperature value is increased by 1° C., the speed of the smart fan 22 is increased by 24%. The CPU voltage increasing rate in the equation (b) may be changed to the memory voltage increasing rate.

Besides, a dictating mode corresponding to the first control point and the second control point is selected via a plurality of sliding bars or a plurality of pull down menus in the control zone.

Figure 8:
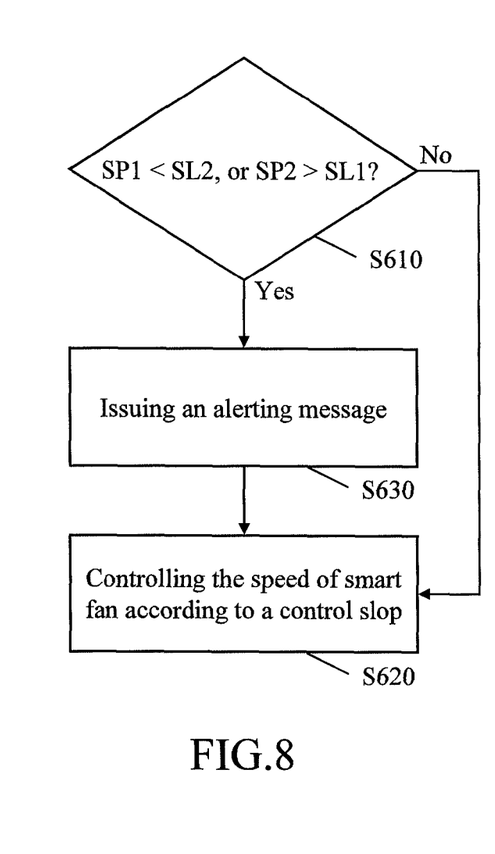
FIG. 8 is a flow chart of a step of S600 according to one embodiment implemented in FIG. 7.

To avoid that the computer 20 is overheated because user adjusts the first control point 362 and the second control point 364 improperly, the step S600 may provide a protection manner as shown in FIG. 8. FIG. 8 is a flow chart of a step of S600 according to one embodiment implemented in FIG. 7.

Firstly, the processor 23 determines whether the first control speed value is smaller than a preset lower speed limit value, or determines whether the second control speed value is greater than a preset upper speed limit value as shown in the step S610. When the first control speed value is smaller than the preset lower speed limit value, or when the second control speed value is greater than the preset upper speed limit value, the processor 23 issues a alerting message and then controls the speed of the smart fan 22 according to the control slop as shown in the step S620. The alerting message may be a text message, a specific icon, an alarm sound or a specific emission element glittering for attracting user's attention.

When the first control speed value is greater than or equal to the preset lower speed limit value, and when the second control speed value is smaller than or equal to the preset upper speed limit value, the processor 23 directly controls the speed of the smart fan 22 according to the control slop as shown in the step S630. The preset lower speed limit value and the preset upper speed limit value may be affected by the parameters of the smart fan 22, such as the upper speed limit value, the upper temperature limit value, the CPU core voltage or the CPU clock multiplier factor.

Specifically, when the first control speed value is smaller than the preset lower speed limit value, the processor 23 sets the first control speed value as the preset lower speed limit value so as to assure that the corresponding hardware unit may not be damaged by over heat. Otherwise, when the second control speed value is greater than the preset upper speed limit value, the processor 23 may limit the baseband, the frequency multiple or the voltage of the corresponding hardware unit to protect the corresponding hardware unit. The control method for smart fan may cooperate with an over-clock software installed in the computer 20 to increase the control slop automatically and thereby supplying higher heat dissipation efficiency under overclock.

As set forth above, the computer uses the control method for smart fan thereof to display the real-time temperature curve and the real-time speed curve in the dynamic updating zone of the GI under the UEFI BIOS mode. Thus, user may know the variations of the sensed temperature value and of the current speed value in a period. When a plurality of temperature sensors or a plurality of smart fans are disposed in the computer, user observe the operation states of various smart fans clearly and conveniently by clicking the sensor switch icons or the fan switch icons.

Moreover, the processor of the computer receives user's commands through the control zone of the GI to set the first control point and second control point, automatically calculates the control slop according to the first control point and the second control point, and controls the speed of the smart fan. Through the GI, user may see images related to the adjusted first control point or to the adjusted second control point immediately, and then determine whether to adjust the first control point and/or the second control point again. Besides, the calculation method of the control slop may refer to the plug-in coefficient or the CPU core voltage. Thus, the heat dissipation efficiency required the computer may be estimated accurately and automatically and be increased while noise is minimized.

The disclosure may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and region of equivalency of the claims are to be embraced within their scope.

What is claimed is:

1. A control method, adapted to control at least one smart fan in a computer in a UNIFIED EXTENSIBLE FIRMWARE INTERFACE BASIC INPUT OUTPUT SYSTEM mode, comprising:
   acquiring a sensed temperature value from at least one temperature sensor, and acquiring a current speed value of the at least one smart fan;
   tracing a real-time temperature curve and a real-time speed curve in a dynamic updating zone of a graphical interface respectively according to the sensed temperature value and the current speed value;
   obtaining a first control point and a second control point, which correspond to the at least one smart fan, through a control zone of the graphical interface,
      wherein the first control point corresponds to a first control temperature value and a first control speed value respectively, and the second control point corresponds to a second control temperature value and a second control speed value respectively;
   tracing a control curve in the graphical interface according to the first control point and the second control point, wherein a control slop of the control curve is set as:

$$\text{Slop} = \frac{(CP - SL1 \times SP2)/SL1}{|CT2 - CT1|/(TL1 \times P1)}$$

where, P1 is a plug-in coefficient, CP is the current speed value, SL1 is a upper speed limit value, SP2 is the second control speed value, CT1 is the first control temperature value, CT2 is the second control temperature value, TL1 is an upper temperature limit value, the plug-in coefficient is equal to 1 when the computer is not over clock, and the plug-in coefficient is an overclock memory frequency rate, a memory voltage increasing rate, a CPU voltage increasing rate or a CPU clock multiplier factor when the computer is over clock; and
   controlling the speed of the at least one smart fan according to the control curve, wherein an amount of the at least one temperature sensor is a plural, and the control method further comprises:
      receiving a first switch instruction triggered by one of a plurality of sensor switch icons of the graphical interface, the sensor switch icons corresponding to the temperature sensors respectively, and the first switch instruction dictating one of the temperature sensors;
      acquiring the sensed temperature value from the dictated temperature sensor; and
      tracing the real-time temperature curve, which corresponds to the dictated temperature sensor, in the dynamic updating zone of the graphical interface according to the sensed temperature value from the dictated temperature sensor.

2. The control method according to claim 1, wherein the real-time temperature curve shows states of the sensed temperature value during a preset period, and the real-time speed curve shows states of the current speed value during the preset period.

3. The control method according to claim 1, wherein the first control temperature value, the first control speed value, the second control temperature value and the second control speed value are acquired, and the first control temperature value, the first control speed value, the second control temperature value and the second control speed value are set by a plurality of sliding bars or a plurality of pull down menus in the control zone.

4. The control method according to claim 1, wherein the step of controlling the speed of the at least one smart fan according to the control curve comprises:
   determining whether the first control speed value is smaller than a preset lower speed limit value, or determining whether the second control speed value is greater than a preset upper speed limit value;
   issuing an alerting message and then controlling the speed of the at least one smart fan according to the control slop when the first control speed value is smaller than the preset lower speed limit value or when the second control speed value is greater than the preset upper speed limit value; and
   controlling the speed of the at least one smart fan according to the control slop when the first control speed value is greater than or equal to the preset lower speed limit value and when the second control speed value is smaller than or equal to the preset upper speed limit value.

5. The control method according to claim 1, wherein a dictating mode corresponding to the first control point and the second control point, is selected via a plurality of sliding bars or a plurality of pull down menus in the control zone.

6. A computer, comprising:
   at least one smart fan;
   at least one temperature sensor; and
   a processor, configured to perform a control method comprising;
   acquiring a sensed temperature value from the at least one temperature sensor, and acquiring a current speed value of the at least one smart fan;
   tracing a real-time temperature curve and a real-time speed curve in a dynamic updating zone of a graphical interface respectively according to the sensed temperature value and the current speed value;
   obtaining a first control point and a second control point, which correspond to the at least one smart fan, via a control zone of the graphical interface,
      wherein the first control point corresponds to a first control temperature value and a first control speed value respectively, and the second control point corresponds to a second control temperature value and a second control speed value respectively;
   tracing a control curve in the graphical interface according to the first control point and the second control point, wherein a control slop of the control curve is set as:

$$\text{Slop} = \frac{(CP - SL1 \times SP2)/SL1}{|CT2 - CT1|/(TL1 \times PR1)}$$

where, P1 is a plug-in coefficient, CP is the current speed value, SL1 is a upper speed limit value, SP2 is the second control speed value, CT1 is the first control temperature value, CT2 is the second control temperature value, TL1 is an upper temperature limit value, the plug-in coefficient is equal to 1 when the computer is not over clock, and the plug-in coefficient is an overclock memory frequency rate, a memory voltage increasing rate, a CPU voltage increasing rate or a CPU clock multiplier factor when the computer is over clock; and controlling the speed of the at least one smart fan according to the control curve, wherein an amount of the at least one temperature sensor is plural, and the control method further comprises:

receiving a first switch instruction which dictates one of the temperature sensors and is triggered by one of a plurality of sensor switch icons in the graphical interface, the sensor switch icons corresponding to the temperature sensors respectively;

acquiring the sensed temperature value from the dictated temperature sensor; and tracing the real-time temperature curve, which corresponds to the dictated temperature sensor, in the dynamic updating, zone of the graphical interface according to the sensed temperature value from the dictated temperature sensor.

7. The computer according to claim 6, wherein the real-time temperature curve shows states of the sensed temperature value during a preset period, and the real-time speed curve shows states of the sensed temperature value and the current speed value during the preset period.

8. The computer according to claim 6, wherein the first control temperature value, the first control speed value, the second control temperature value and the second control speed value are acquired, and the first control temperature value, the first control speed value, the second control temperature value and the second control speed value are set by a plurality of sliding bars or a plurality of pull down menus in the control zone.

9. The computer according to claim 6, wherein the step of controlling the speed of the at least one smart fan according to the control curve comprises:

determining whether the first control speed value is smaller than a preset lower speed limit value, or determining whether the second control speed value is greater than a preset upper speed limit value;

issuing an alerting message and then controlling the speed of the at least one smart fan according to the control slop when the first control speed value is smaller than the preset lower speed limit value or when the second control speed value is greater than the preset upper speed limit value; and controlling the speed of the at least one smart fan according to the control slop when the first control speed value is greater than or equal to the preset lower speed limit value and when the second control speed value is smaller than or equal to the preset upper speed limit value.

10. The computer according to claim 6, wherein a dictating mode, which corresponds to the first control point and the second control point, is selected via a plurality of sliding bars or a plurality of pull down menus in the control zone.

11. A control method, adapted to control at least one smart fan in a computer in a UNIFIED EXTENSIBLE FIRMWARE INTERFACE BASIC INPUT OUTPUT SYSTEM mode, comprising:

acquiring a sensed temperature value from at least one temperature sensor, and acquiring a current speed value of the at least one smart fan;

tracing a real-time temperature curve and a real-time speed curve in a dynamic updating zone of a graphical interface respectively according to the sensed temperature value and the current speed value;

obtaining a first control point and a second control point, which correspond to the at least one smart fan, through a control zone of the graphical interface, wherein the first control point corresponds to a first control temperature value and a first control speed value respectively, and the second control point corresponds to a second control temperature value and a second control speed value respectively;

tracing a control curve in the graphical interface according to the first control point and the second control point, wherein a control slop of the control curve is set as:

$$Slop = \frac{(CP - SL1 \times SP2)/SL1}{|CT2 - CT1|/(TL1 \times PR1)}$$

where, P1 is a plug-in coefficient, CP is the current speed value, SL1 is a upper speed limit value, SP2 is the second control speed value, CT1 is the first control temperature value, CT2 is the second control temperature value, TL1 is an upper temperature limit value, the plug-in coefficient is equal to 1 when the computer is not over clock, and the plug-in coefficient is an overclock memory frequency rate, a memory voltage increasing rate, a CPU voltage increasing rate or a CPU clock multiplier factor when the computer is over clock; and controlling the speed of the at least one smart fan according to the control curve wherein an amount of the at least one temperature sensor is plural, and the control method further comprises:

receiving a switch instruction which dictates one of the smart fans and is triggered by one of a plurality of fan switch icons in the graphical interface, and the fan switch icons corresponding to the smart fans respectively;

acquiring the current speed value of the dictated smart fan; and tracing the real-time speed curve, which corresponds to the dictated smart fan, in the dynamic updating zone of the graphical interface according to the current speed value of the dictated smart fan.

12. A computer, comprising:

at least one smart fan;

at least one temperature sensor; and a processor, configured to perform a control method comprising:

acquiring a sensed temperature value from the at least one temperature sensor, and acquiring a current speed value of the at least one smart fan;

tracing a real-time temperature curve and a real-time speed curve in a dynamic updating zone of a graphical interface respectively according to the sensed temperature value and the current speed value;

obtaining a first control point and a second control point, which correspond to the at least one smart fan, via a control zone of the graphical interface, wherein the first control point corresponds to a first control temperature value and a first control speed value respectively, and the second control point corresponds to a second control temperature value and a second control speed value respectively;

tracing a control curve in the graphical interface according to the first control point and the second control point, wherein a control slop of the control curve is set as:

$$\text{Slop} = \frac{(CP - SL1 \times SP2)/SL1}{|CT2 - CT1|/(TL1 \times P1)}$$

where, P1 is a plug-in coefficient, CP is the current speed value, SL1 is a upper speed limit value, SP2 is the second control speed value, CT1 is the first control temperature value, CT2 is the second control temperature value, TL1 is an upper temperature limit value, the plug-in coefficient is equal to 1 when the computer is not over clock, and the plug-in coefficient is an overclock memory frequency rate, a memory voltage increasing rate, a CPU voltage increasing rate or a CPU clock multiplier factor when the computer is over clock; and controlling the speed of the at least one smart fan according to the control curve wherein an amount of the at least one smart fan is plural, and the control method further comprises:

receiving a switch instruction which dictates one of the smart fans and is triggered by one of a plurality of fan switch icons in the graphical interface, and the fan switch icons corresponding to the smart fans respectively;

acquiring the current speed value of the dictated smart fan; and tracing the real-time speed curve, which corresponds to the dictated smart fan, in the dynamic updating zone of the graphical interface according to the current speed value of the dictated smart fan.

\* \* \* \* \*